(12) United States Patent  (10) Patent No.: US 7,904,273 B2
Liu et al.  (45) Date of Patent: Mar. 8, 2011

(54) IN-LINE DEPTH MEASUREMENT FOR THRU SILICON VIA

(75) Inventors: Qizhi Liu, Essex Junction, VT (US); Ping-Chuan Wang, Hopewell Junction, NY (US); Kimball M. Watson, Essex Junction, VT (US); Zhijian J. Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 12/371,724

(22) Filed: Feb. 16, 2009

(65) Prior Publication Data

US 2010/0210043 A1 Aug. 19, 2010

(51) Int. Cl.
*G06F 19/00* (2006.01)

(52) U.S. Cl. ............ 702/155; 702/179; 438/14; 438/17; 438/16; 438/48; 438/50; 438/372; 257/E21.53

(58) Field of Classification Search .................. 702/155, 156/345.16, 345.24; 438/14, 17, 22, 24, 438/16, 466, 33, 401, 667, 48–52, 372; 257/E21.53, 257/E21.2, E21.135, E21.255, 315, 287, 257/E21.429
See application file for complete search history.

(56) References Cited

U.S. PATENT DOCUMENTS

| | | | |
|---|---|---|---|
| 4,481,061 A | 11/1984 | Ross | |
| 5,973,348 A * | 10/1999 | Ishibashi | 257/306 |
| 6,129,807 A | 10/2000 | Grimbergen et al. | |
| 6,396,076 B1 | 5/2002 | Tom | |
| 6,709,881 B2 | 3/2004 | Hasegawa et al. | |
| 6,720,299 B2 | 4/2004 | Chapple et al. | |
| 6,775,903 B2 * | 8/2004 | Horng et al. | 29/603.14 |
| 6,977,186 B2 | 12/2005 | Hasegawa et al. | |
| 7,088,618 B2 * | 8/2006 | Hoshino et al. | 365/185.05 |
| 7,205,173 B2 * | 4/2007 | Brunson et al. | 438/48 |
| 7,487,064 B2 * | 2/2009 | Lim | 702/179 |
| 7,772,868 B2 * | 8/2010 | Doong et al. | 324/765 |
| 2002/0057176 A1 | 5/2002 | Norstrom et al. | |
| 2005/0027476 A1 * | 2/2005 | Lim | 702/179 |
| 2006/0154388 A1 | 7/2006 | Lewington et al. | |
| 2007/0037394 A1 * | 2/2007 | Su et al. | 438/687 |
| 2007/0170511 A1 * | 7/2007 | Huang | 257/355 |
| 2007/0184565 A1 * | 8/2007 | Park et al. | 438/14 |
| 2009/0278238 A1 * | 11/2009 | Bonifield et al. | 257/621 |
| 2009/0289648 A1 * | 11/2009 | Lamson et al. | 324/754 |
| 2010/0156453 A1 * | 6/2010 | Doong et al. | 324/765 |

* cited by examiner

*Primary Examiner* — Carol S Tsai

(74) *Attorney, Agent, or Firm* — Gibb I.P. Law Firm, LLC; Yuanmin Cai, Esq.

(57) ABSTRACT

A system, method and device for measuring a depth of a Through-Silicon-Via (TSV) in a semiconductor device region on a wafer during in-line semiconductor fabrication, includes a resistance measurement trench structure having length and width dimensions in a substrate, ohmic contacts on a surface of the substrate disposed on opposite sides of the resistance measurement trench structure, and an unfilled TSV structure in semiconductor device region having an unknown depth. A testing circuit makes contact with the ohmic contacts and measures a resistance therebetween, and a processor connected to the testing circuit calculates a depth of the trench structure and the unfilled TSV structure based on the resistance measurement. The resistance measurement trench structure and the unfilled TSV are created simultaneously during fabrication.

20 Claims, 6 Drawing Sheets

IN-LINE DEPTH MEASUREMENT FOR THRU SILICON VIA

BACKGROUND OF THE INVENTION

1. Field of the Invention

The present invention generally relates to measuring a depth of a Through-Silicon-Via (TSV) during in-line semiconductor fabrication before the TSV is filled with conductive material.

2. Description of the Related Art

Within silicon-based semiconductor manufacturing techniques there is no in-line measurement method available prior to metal fill/wafer grinding/BSM deposition to determine the TSV yield. In other words, the TSV yield determination can only be obtained after the BSM deposition, and thus any poor yields cannot be recovered before the end of entire fabrication process.

Through-Silicon-Vias (TSVs) are not electrically functional before wafer thinning and back-side-metal (BSM) deposition, and therefore the conventional in-line electrical test cannot be used to determine the yield of the TSVs in a timely fashion before being filled with conductive material. In other words, the yield determination can only be detected after the TSVs are filled with conductive material, and thus any poor yields cannot be recovered once filled with a conductive material.

There exists a need to provide a test to determine the depth of TSVs before they are filled with conductive material so that if the TSVs are determined to be inadequately formed in depth, the semiconductors may be re-etched to improve the yield before being filled with conductive material.

SUMMARY OF THE INVENTION

In view of the foregoing and other exemplary problems, drawbacks, and disadvantages of the conventional methods and structures, the exemplary aspects of the present invention provide a system, method and device for in-line depth measurement of a TSV.

An exemplary aspect of the present invention comprises a resistance measurement trench structure having a predetermined length and width dimensions in a substrate. Ohmic contacts are disposed on a surface of the substrate on opposite sides of the resistance measurement trench structure. At least one unfilled TSV structure in semiconductor device region having an unknown depth is created at the same time the resistance measurement trench structure is formed. A testing circuit contacts the ohmic contacts and measures a resistance therebetween, and a processor connected to the testing circuit calculates a depth of the unfilled TSV structure based on the pre-determined correlation between measured resistance and the depth of the resistance measurement trench structure.

In another exemplary aspect of the present invention, isolation trenches are formed in the substrate surrounding each of the ohmic contacts on sides not facing the resistance measurement trench structure. The isolation trenches are implemented to block the measurement current from passing the sides of the resistance measurement trench structure, so that all the current passes underneath the resistance measurement trench structure between the ohmic contacts. The isolation trenches may each include a necked portion between the ohmic contacts and the resistance measurement trench structure, where the necked portion reduces a cross sectional area of the substrate between the ohmic contacts and the resistance measurement trench structure, the cross sectional area being used as a current pathway between the ohmic contacts during resistance measurement. The predetermined length and width dimensions of the resistance measurement trench structure are correlated to a predetermined cross-section geometry of the TSV during the calculation of the depth of the unfilled TSV based on the resistance measurement. The testing circuit comprises a 4-terminal, (Kelvin bridge), sensing configuration, where each connection from the testing circuit to the ohmic contacts include separate pairs of current-carrying and voltage-sensing electrodes. Additionally, the ohmic contacts comprise a silicide deposited on an upper surface of a P− substrate further including a P+ doped region immediately under the silicide.

With its unique and novel features, the present invention provides a system, method and device for measuring a depth of a Through-Silicon-Via (TSV) in a semiconductor device region on a wafer during in-line semiconductor fabrication. An embedded resistance measurement structure for TSV depth may implemented in a non-kerf region or a kerf region of a substrate and is conducted in-line before a TSV metal fill. This allows for under-etched TSV to be re-worked before a metal fill. Additional benefits are a self-calibration capability where there is no need for construction analyses for measurement calibration, and ohmic contacts for accurate 4-point probe measurement of resistance.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Referring now to the drawings, and more particularly to FIGS. 1-6, there are shown exemplary embodiments of the method and structures of the present invention.

Figure 1:
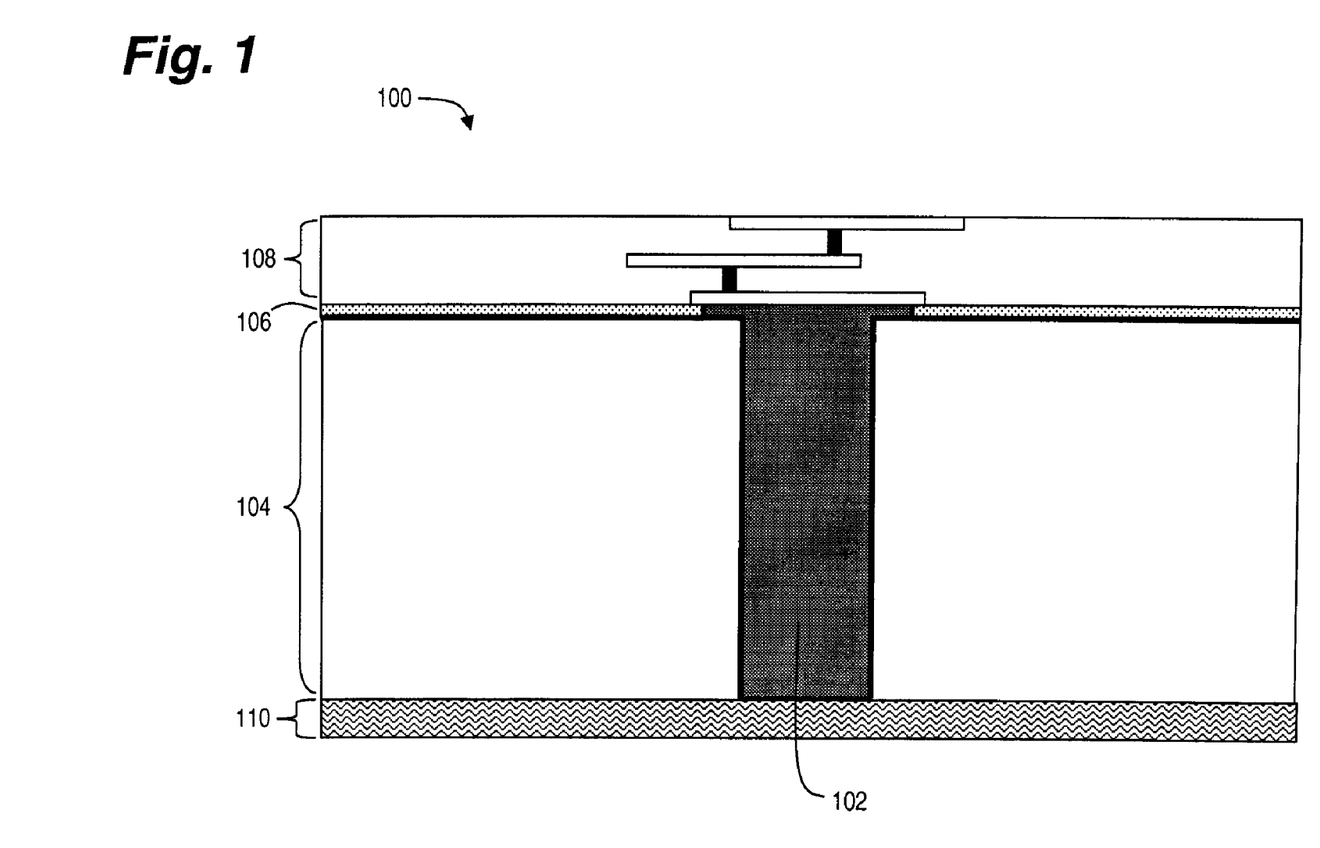
FIG. 1 illustrates a Through-Silicon-Via (TSV) in a semiconductor substrate in a region of integrated circuitry.

FIG. 1 illustrates semiconductor 100 including a Through-Silicon-Via (TSV) 102 developed for various technologies and applications such as silicon carriers (interposers) and three-dimensional integrated circuit (3D) integration. The TSVs 102 are mainly used for providing electrical continuity (power passing, ground, I/Os, etc.) through the silicon die 104 between top and bottom surfaces. Generally, TSVs are fabricated by deep etching into the silicon wafer 104, (on the order of 100 μm in depth), insulating the deep via hole, filling the via holes with liner/metal (e.g., W, Cu, etc.), thinning the wafer from the back side until the via metal is exposed, and optionally followed by the deposition of a blanket metal film 110 (i.e. back-side-metal, or BSM) for electrical contact. Oxide or nitride layer 106 covers the silicon layer 104 and a Back-End-Of-Line (BEOL) stack 108 is formed thereupon.

Figure 2A:
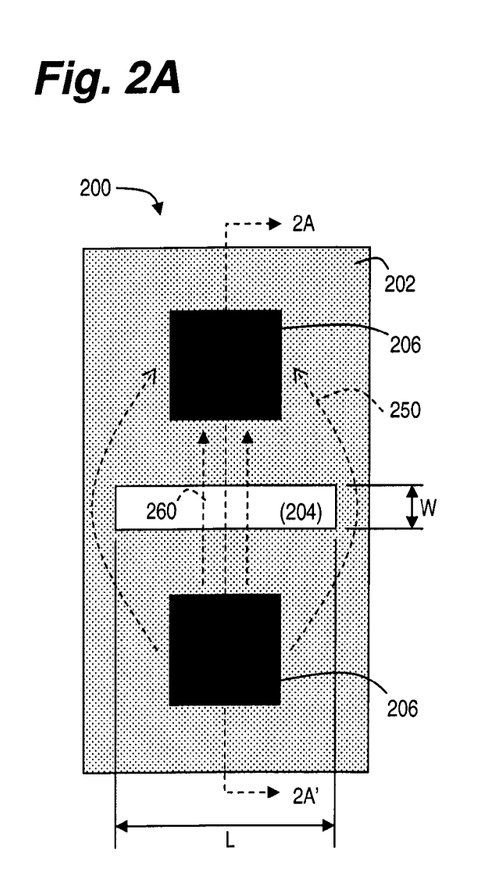
FIG. 2A illustrates a top view of a system and a device of the present invention.
Figure 2B:
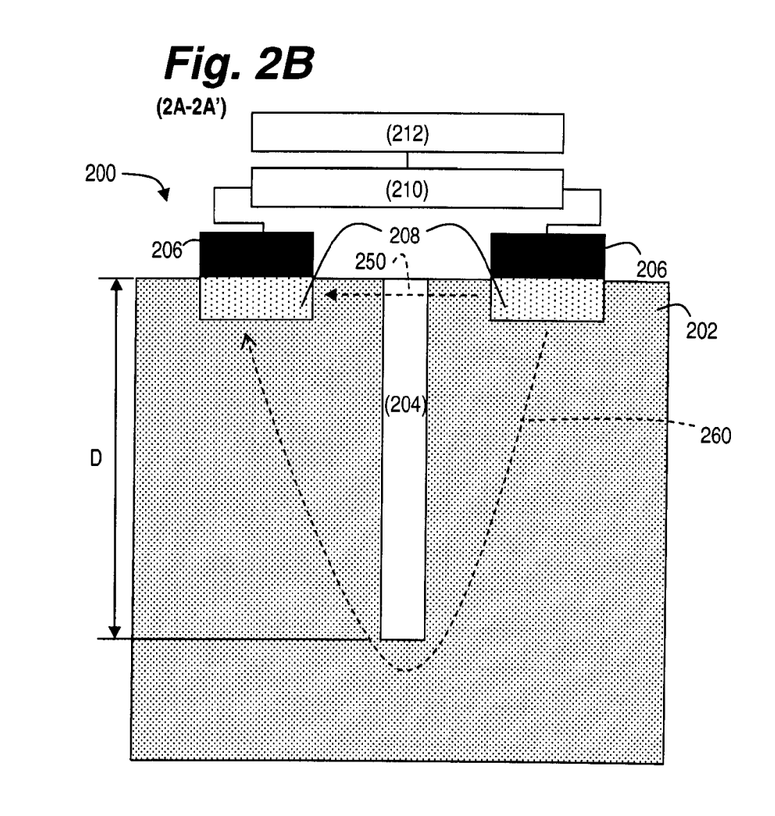
FIG. 2B illustrates a cross-sectional view of a system and a device of the present invention along lines 2A-2A' of FIG. 2A.

FIG. 2A illustrates a top view of an exemplary embodiment 200 and FIG. 2B illustrates a cross-sectional view taken along lines 2A-2A' of FIG. 2A. Reference number 202 illustrates a portion of a silicon substrate located in kerf region of a semiconductor wafer, (see FIG. 5). A trench 204 having a width W, length L and depth D, is etched into the substrate 202 in the kerf region and is used to estimate the depth of a TSV in located in an integrated circuitry region of the wafer distinct from the kerf region on the wafer. The measuring trench 204 may also be positioned in the integrated circuitry region of the wafer. The two ohmic contacts 206 are located on either side of the trench 204 on the top surface of the substrate. Under each ohmic contact 206 is an implanted P+ doped region 208 that can be located in a P− substrate 202 that can have a thickness between 100-1000 μm with a doping level on the order of $5 \times 10^{15}$ cm$^{-3}$.

A resistance measuring device 210 contacts each of the ohmic contacts to measure a resistance between the contacts. The resistance measuring device 210 may include a four-terminal sensing (4T or Kelvin sensing) electrical impedance measuring device that uses separate pairs of current-carrying and voltage-sensing electrodes. 4T sensing separates the current and voltage electrodes and allows an ohmmeter/impedance analyzer to eliminate the impedance contribution of the wiring and contact resistances. U.S. Pat. No. 7,411,298 illustrates a Kelvin pattern in FIG. 7 used to measure contact resistivity via a four-terminal (4T) measurement.

In the configuration of FIGS. 2A-2B, when the four terminal sensing bridge 210 is applied to both ohmic contacts 206, a vertical current path 260 is formed between the ohmic contacts 206 in a straight-line configuration under the deepest portion (D) of the trench 204. This current path 260 is directly correlated with the depth of the trench 204. Additionally, a lateral current 250 path in a direction parallel with the top surface of the substrate 202, or edge effect current, is formed between the contacts 206 around peripheral edges of the trench 204, which is not correlated with the depth of the TSV, and should be minimized or blocked in this proposed measurement.

A processing device or external measurement equipment 212 takes the measured resistance from the resistance measuring device and makes a determination of the depth of an unfilled TSV structure located in a semiconductor component region of a chip.

The determination of a depth of an unfilled TSV is based indirectly on the resistance measurement between ohmic contacts 206. Note that the silicon etching rate is dependent on the aspect ratio of the trench 204, therefore, with the width W held constant, the depth D of the trench is proportional to the length L of the trench. Therefore, by implementing a plurality of such unfilled TSV with different length L in the kerf region, and by measuring their respective resistance using the proposed test structure and methodology, a correlation between measured resistance and trench depth D can be pre-established for accurate determination of other TSVs in a semiconductor component region of a chip.

Correlation between the resistance measurement and the TSV depth may also be established based on the aspect ratio (L, given a constant W) of the resistance measurement trench 204 that correlates to a depth of a TSV in the semiconductor component region of a chip. The resistance measurement trench 204 and an unfilled TSV are created simultaneously during fabrication so that both structures receive an identical etch rate as long as they have the same aspect ratio. The resistance measurement across the ohmic contacts 206 is determined to be a particular value, and that value denotes a corresponding depth of the resistance measurement trench 204. Thus, the depth of a TSV may be determined using the previously established correlation since the measured depth corresponds to an identical etch rate of the simulation trench 204.

Figure 3A:
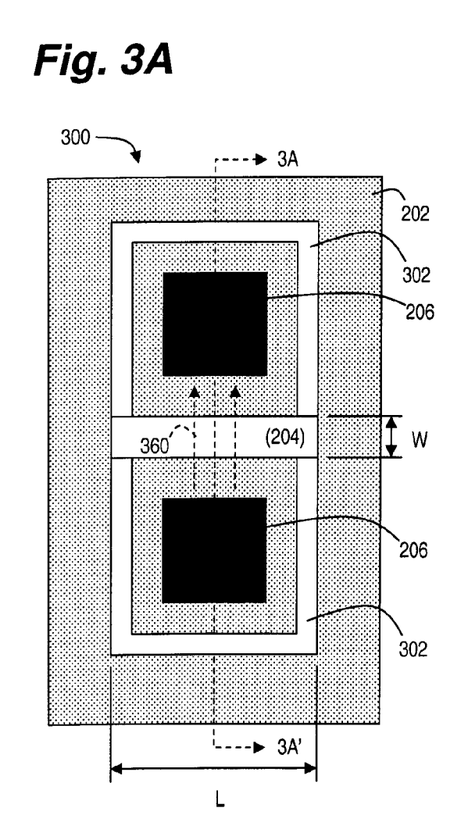
FIG. 3A illustrates a top view of a system and a device of the present invention.
Figure 3B:
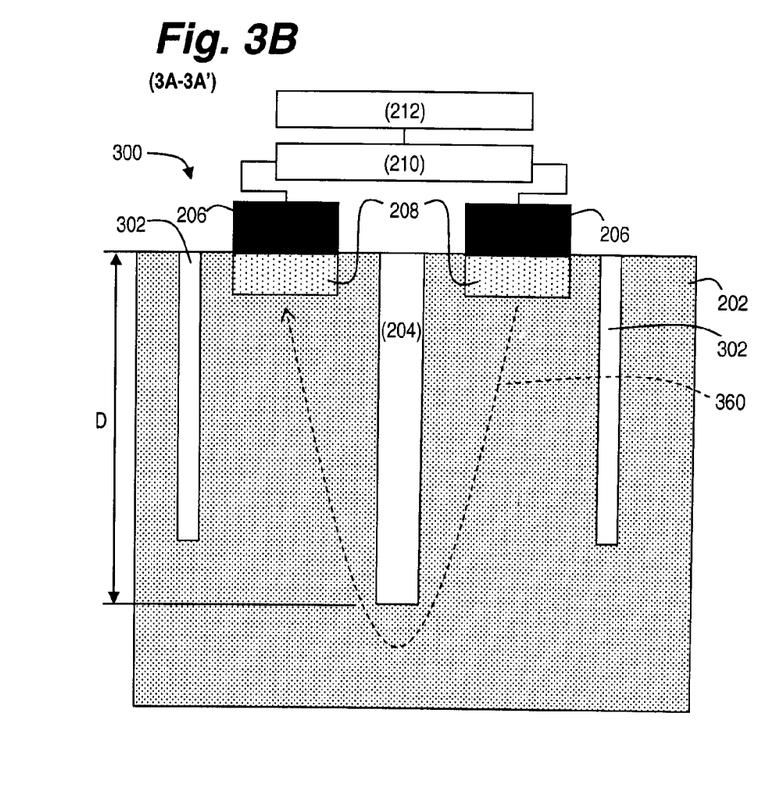
FIG. 3B illustrates a cross-sectional view of a system and a device of the present invention along lines 3A-3A' of FIG. 3A.

FIG. 3A illustrates a top view of a second exemplary embodiment 300 and FIG. 3B illustrates a cross-sectional view along lines 3A-3A' of FIG. 3A. FIGS. 3A-3B are identical to the invention of FIGS. 2A-2B except for the inclusion of a trench border 302, or moat, that surrounds the ohmic contacts 206 to minimize the "edge effect" with current 250 shown in FIGS. 2A-2B traveling in a lateral direction around the resistance measurement trench 204 between the contacts 206. The trench border 302 forces the current path 360 between the contacts 206 to be in a vertical direction extending under the deepest (D) part of the resistance measurement trench 204. Therefore, the trench border 302 formed in the kerf region of the substrate 202 surrounds each of the ohmic contacts 206 on sides not facing the resistance measurement trench 204 to force the current path under the resistance measurement trench 204.

Figure 4A:
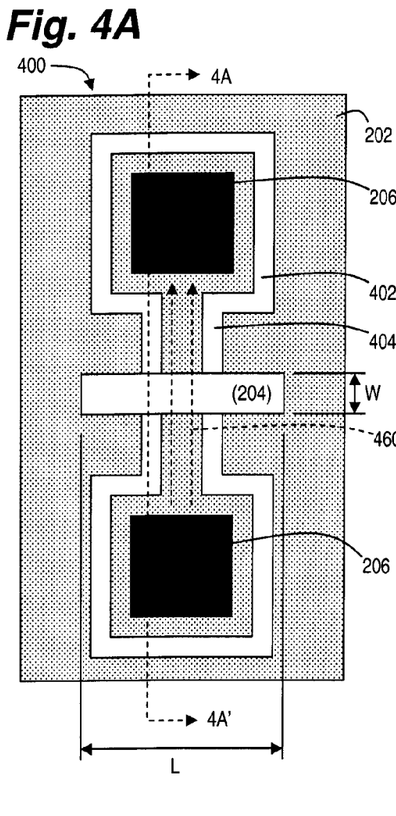
FIG. 4A illustrates a top view of a system and a device of the present invention.
Figure 4B:
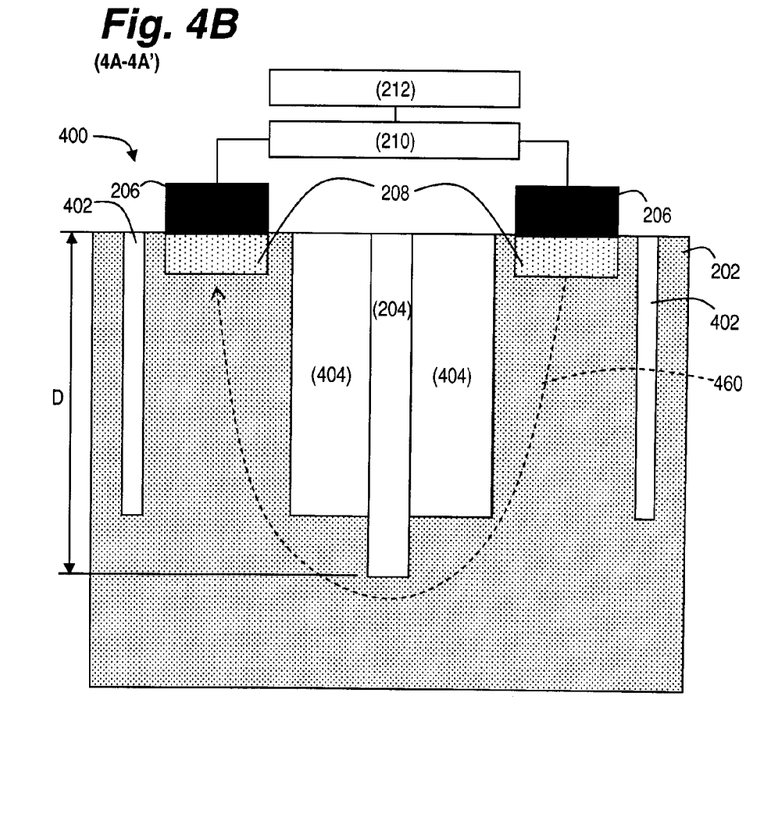
FIG. 4B illustrates a cross-sectional view of a system and a device of the present invention along lines 4A-4A' of FIG. 4A.

FIG. 4A illustrates a top view of a third exemplary embodiment of the present invention and FIG. 4B illustrates a cross-sectional view along lines 4A-4A' of FIG. 4A. FIGS. 4A-4B are identical to the invention of FIGS. 3A-3B except trench border 402, or moat, that surrounds the ohmic contacts 206 contains an necked portion 404 between each of the contacts 206 and trench 204 to further minimize the "edge effect" current. The trench border necked portion 404 forces the current path b460 through narrow portion of the silicon substrate 202 between the contacts 206 in a vertical direction extending under the deepest (D) part of the resistance measurement trench 204. Therefore, the trench border 402 formed in the kerf region of the substrate 202 surrounds the contacts 206 on sides not facing the resistance measurement trench 204 further forces the current path under the resistance measurement trench 204 and through the necked portion 404.

Figure 5:
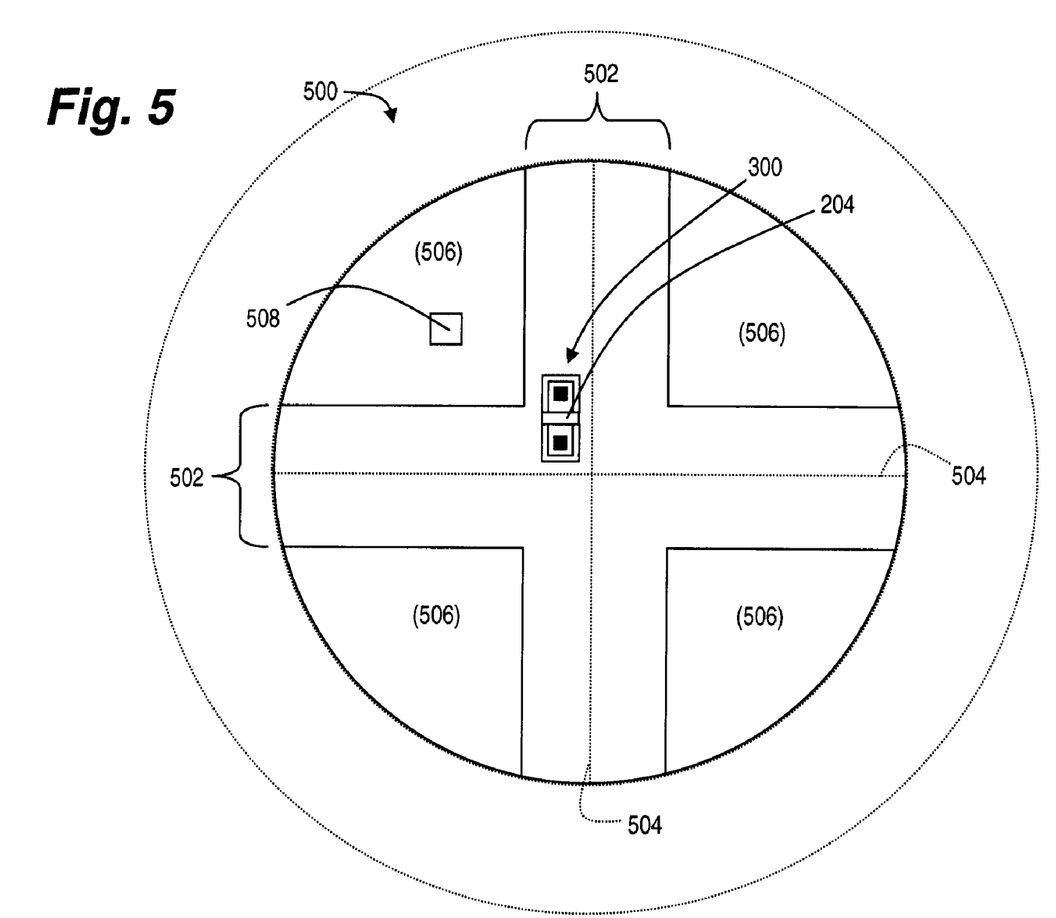
FIG. 5 illustrates a top view of a device of the present invention in a kerf region of semiconductor wafer.

FIG. 5 illustrates a top view 500 of one embodiment having a resistance measurement structure 300, for example, shown in FIGS. 3A-3B, located in a kerf region 502. The kerf region 502 has central partition lines 504 between integrated circuitry regions 506 containing active and passive circuitry elements. The TSV 508 in the chip region is formed simultaneously during the etching process that forms the resistance measurement trench 204.

Figure 6:
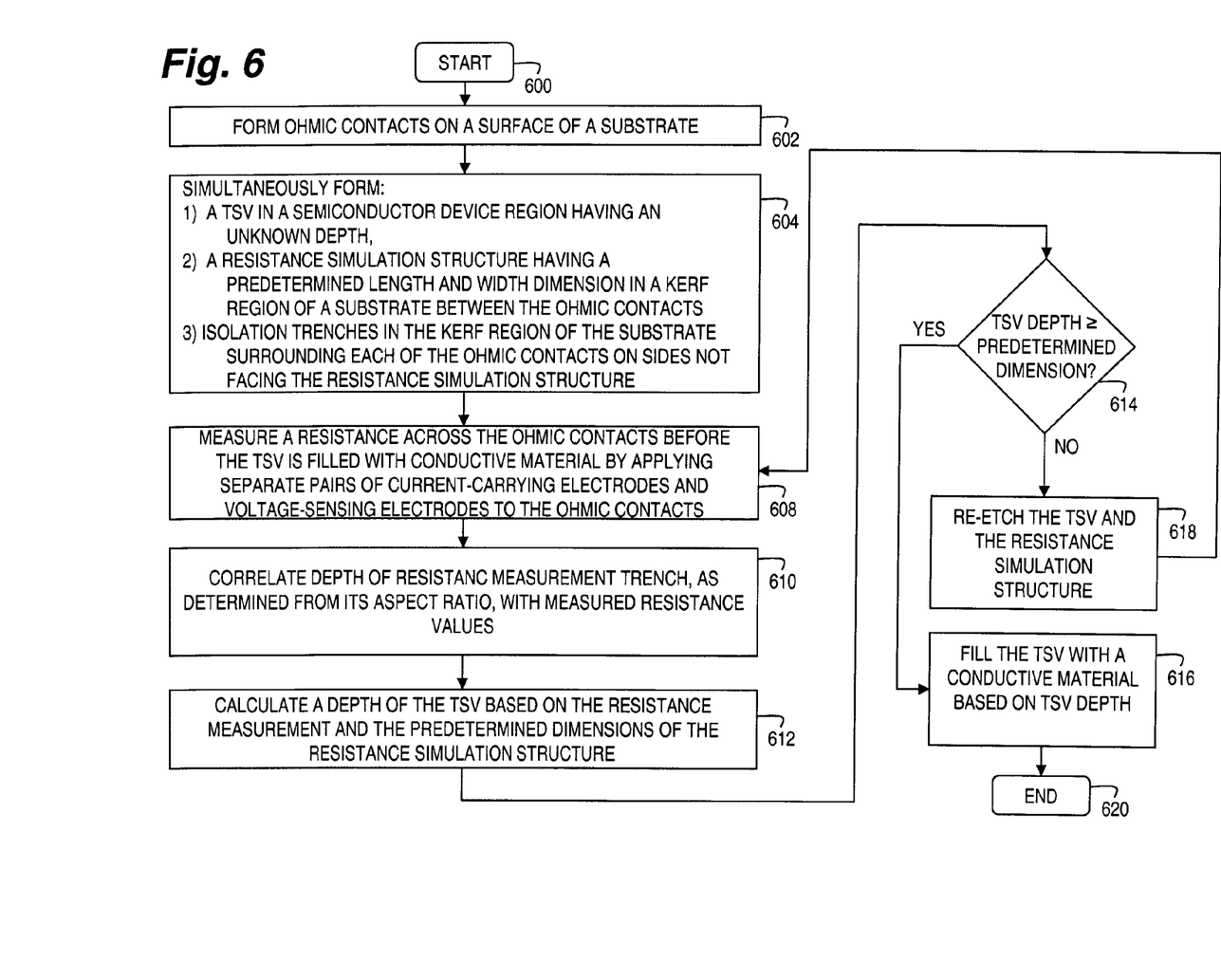
FIG. 6 illustrates a logic flow chart of a method of the present invention.

FIG. 6 illustrates a logic flow chart of one exemplary method of measuring a depth of the Through-Silicon-Via (TSV) in the semiconductor device region on the wafer during in-line semiconductor fabrication starting at 600. The method includes forming 602 ohmic contacts 206 on the surface of the substrate 202. Simultaneously forming, at 604, 1) a TSV in a semiconductor device region having an unknown depth, 2) a resistance measurement trench 204 having a predetermined length L and width W dimension are formed 604 in a kerf region 502 of a substrate 202 between the ohmic contacts 206, and 3) isolation trenches may be formed simultaneously with the TSV and the measurement trench in the kerf region 502 of the substrate 202 surrounding each of the ohmic contacts 206 on sides not facing the resistance measurement trench structure. Optionally, isolation trenches each may include a necked portion 404, (see FIGS. 4A-4B), between the ohmic contacts 206 and the resistance measurement trench structure, where the necked portion 404 reduces a cross sectional area of the substrate 202 between the ohmic contacts 206 and the resistance measurement trench structure 204. (Steps 602 and 604 may be performed in reverse order.)

A resistance measurement 608 is then conducted across the ohmic contacts 206 before conductive material is filled in the TSV, resistance measurement trench and, optionally, the isolation trench. The measuring of the resistance further includes applying separate pairs of current-carrying electrodes and voltage-sensing electrodes to the ohmic contacts 206 as mentioned above.

The depth of the resistance measurement trench, as determined from its aspect ratio (i.e., width W and length L), is correlated with the measured resistance values 610. Such correlation can then be used to determine the depth of the at least one unfilled TSV located in a semiconductor component region of a chip based on the resistance measurement.

The depth of the TSV is calculated 612 based on the resistance measurement and the correlation to the predetermined resistance-depth correlation. The method then determines whether the calculated depth of the TSV is less than a predetermined dimension 614. This predetermined dimension may be the designed target depth of the TSV.

If the predetermined depth dimension is not reached, TSV and the resistance measurement trench structure is re-etched 618, and then re-measured 608 for a second resistance across the ohmic contacts before the TSV is filled with conductive material. Re-calculating second depth (at 612) of the TSV is based on the second resistance measurement and the correlation to the predetermined dimensions of the resistance measurement trench structure.

Once again, if the depth of the TSV is determining to be greater than or equal to a predetermined dimension, the TSV is filled 616 with a conductive material and the process then ends 620.

In other words, the resistance simulation structure includes the resistance measurement trench having a known aspect ratio. A depth of said trench is determined by comparing the measured resistance of the trench to a known calibration curve correlating measured resistance to trench depth. An aspect ratio of said unfilled via structure (TSV) is determined based on the design parameters of the unfilled TSV structure. A depth of the unfilled TSV structure is then calculated based on comparing said aspect ratio of said unfilled TSV structure with the trench depth determined.

With its unique and novel features, the present invention provides a method and structure to measure the depth of a Through-Silicon-Via (TSV) in a semiconductor device region on a wafer in-line during semiconductor fabrication. An embedded resistance measurement structure for TSV depth is positioned in the kerf region and measurement of via depth is conducted in-line before the TSV metal fill. This allows for an under-etched TSV to be re-worked before metal fill. Additional benefits are a self-calibration capability where there is no need for construction analyses or measurement calibration of ohmic contacts for accurate 4-point probe measurement of resistance.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A system for measuring a depth of at least one unfilled via structure in a semiconductor device region on a wafer in-line during semiconductor fabrication, said system comprising:
   a resistance simulation structure in a substrate;
   ohmic contacts on a surface of said substrate disposed on opposite sides of said resistance simulation structure;
   a testing circuit in contact with said ohmic contacts, said testing circuit measuring a resistance between said ohmic contacts; and
   a processor connected to said testing circuit, said processor calculating a depth of said at least one unfilled via structure based on said resistance measurement and a predetermined correlation between resistance and dimensions of said resistance simulation structure,
   said resistance simulation structure and said at least one unfilled via being created during a same fabrication process.

2. The system according to claim 1, wherein said resistance simulation structure comprises a trench having a known aspect ratio, wherein said processor calculating said depth of said at least one unfilled via structure comprises:
   determining a depth of said trench by comparing said measured resistance to a calibration curve correlating measured resistance to trench depth;
   determining an aspect ratio of said unfilled via structure; and
   calculating a depth of said unfilled via structure based on comparing said aspect ratio of said unfilled via structure with said trench depth.

3. The system according to claim 1, further comprising:
   isolation trenches formed in said substrate surrounding each of said ohmic contacts on sides not facing said resistance simulation structure.

4. The system according to claim 3, wherein said isolation trenches each include a necked portion between said ohmic contacts and said resistance simulation structure, where said necked portion reduces a cross sectional area of said substrate between said ohmic contacts and said resistance simulation structure, said cross sectional area being used as a current pathway between said ohmic contacts during resistance measurement.

5. The system according to claim 1, wherein said predetermined length and width dimensions of said resistance simulation structure are correlated to a predetermined cross-section geometry of said at least one via during said calculation of said depth of said at least one unfilled via based on said resistance measurement.

6. The system according to claim 1, wherein said testing circuit comprises a 4-terminal, (Kelvin bridge), sensing device, where each connection from said testing circuit to said ohmic contacts include separate pairs of current-carrying and voltage-sensing electrodes.

7. The system according to claim 1, wherein said ohmic contacts comprise silicide deposited on an upper surface of a P− substrate further including a P+ doped region immediately under said deposited silicide.

8. A resistance simulation device that enables the determination of a depth of a via in a semiconductor device region on a wafer in-line during semiconductor fabrication, said device comprising:

a resistance simulation structure having predetermined length and width dimensions in a substrate;

ohmic contacts on a surface of said substrate disposed on opposite sides of said resistance simulation structure;

a testing circuit in contact with said ohmic contacts, said testing circuit measuring a resistance between said ohmic contacts;

a processor connected to said testing circuit, said processor calculating a depth of said at least one unfilled via structure based on said resistance measurement and a predetermined correlation between resistance and dimensions of said resistance simulation structure; and isolation trenches formed in said substrate surrounding each of said ohmic contacts on sides not facing said resistance simulation structure.

9. The device according to claim 8, wherein said resistance simulation structure comprises a trench having a known aspect ratio, wherein a depth of said trench is determined by a processor by comparing said measured resistance to a calibration curve correlating measured resistance to trench depth, wherein an aspect ratio of said unfilled via structure is determined; and wherein a depth of said unfilled via structure is calculated by said processor based on comparing said aspect ratio of said unfilled via structure with said trench depth.

10. The device according to claim 8, wherein said ohmic contacts comprise a silicide deposited on an upper surface of a P− substrate further including a P+ doped region immediately under said deposited silicide.

11. The device according to claim 8, wherein said isolation trenches each include a necked portion between said ohmic contacts and said resistance simulation structure, where said necked portion reduces a cross sectional area of said substrate between said ohmic contacts and said resistance simulation structure, said cross sectional area being used as a current pathway between said ohmic contacts during resistance measurement.

12. The device according to claim 11, wherein said resistance simulation structure further comprises a trench having a rectangular shaped cross-section.

13. The device according to claim 11, wherein said ohmic contacts comprise a silicide deposited on an upper surface of a P− substrate further including a P+ doped region immediately under said deposited silicide.

14. A computer-implemented method for measuring a depth of a via in a semiconductor device region on a wafer in-line during semiconductor fabrication, said method comprising:

forming ohmic contacts on a surface of a substrate; forming:

a via in a semiconductor device region having an unknown depth, and a resistance simulation trench in a substrate between said ohmic contacts;

using a computerized device, measuring a resistance across said ohmic contacts before said via is filled with material to determine a depth of said resistance simulation trench; and using said computerized device, calculating a depth of said via based on said depth of said resistance simulation structure.

15. The method of claim 14, further comprising:

forming isolation trenches in said substrate surrounding each of said ohmic contacts on sides not facing said resistance simulation structure.

16. The method of claim 15, wherein said isolation trenches each include a necked portion between said ohmic contacts and said resistance simulation structure, where said necked portion reduces a cross sectional area of said substrate between said ohmic contacts and said resistance simulation structure, said cross sectional area being used as a current pathway between said ohmic contacts during resistance measurement.

17. The method of claim 14, further comprising:

correlating said predetermined length and width dimensions of said resistance simulation structure to a known cross-section geometry of said at least one via during said calculation of said depth of said at least one unfilled via based on said resistance measurement.

18. The method of claim 14, further comprising:

determining said depth of said via is less than a predetermined dimension;

re-etching said via and said resistance simulation structure;

re-measuring a second resistance across said ohmic contacts before said via is filled with conductive material; and re-calculating a second depth of said via based on said second resistance measurement and said predetermined dimensions of said resistance simulation structure.

19. The method of claim 14, wherein said measuring said resistance further comprises:

applying separate pairs of current-carrying electrodes and voltage-sensing electrodes to said ohmic contacts.

20. The method of claim 14, further comprising:

determining whether said depth of said via is greater than or equal to a predetermined dimension; and subsequently filling said via with said conductive material based on said determining.

* * * * *